(12) United States Patent
Shibata et al.

(10) Patent No.: US 9,680,040 B2
(45) Date of Patent: Jun. 13, 2017

(54) SEMICONDUCTOR DEVICE AND METHOD FOR MANUFACTURING THE SAME

(71) Applicant: SUMITOMO ELECTRIC INDUSTRIES, LTD., Osaka-shi, Osaka (JP)

(72) Inventors: Kaoru Shibata, Itami (JP); Katsushi Akita, Itami (JP); Kei Fujii, Itami (JP); Takashi Ishizuka, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 117 days.

(21) Appl. No.: 14/784,817

(22) PCT Filed: Apr. 16, 2014

(86) PCT No.: PCT/JP2014/060775
§ 371 (c)(1),
(2) Date: Oct. 15, 2015

(87) PCT Pub. No.: WO2014/175128
PCT Pub. Date: Oct. 30, 2014

(65) Prior Publication Data
US 2016/0056315 A1 Feb. 25, 2016

(30) Foreign Application Priority Data

Apr. 23, 2013 (JP) ................. 2013-090478
Jul. 3, 2013 (JP) ................. 2013-140001
Aug. 9, 2013 (JP) ................. 2013-166656

(51) Int. Cl.
*H01L 33/00* (2010.01)
*H01L 31/0352* (2006.01)
(Continued)

(52) U.S. Cl.
CPC .. *H01L 31/035236* (2013.01); *H01L 27/1464* (2013.01); *H01L 27/14652* (2013.01);
(Continued)

(58) Field of Classification Search
CPC ................. H01L 33/32; H01L 33/06
See application file for complete search history.

(56) References Cited

U.S. PATENT DOCUMENTS

2011/0210313 A1* 9/2011 Fujii ............... B82Y 20/00
257/21
2013/0026446 A1 1/2013 Han et al.

FOREIGN PATENT DOCUMENTS

EP       2 299 549 A2   3/2011
JP       2009-206499 A  9/2009
(Continued)

OTHER PUBLICATIONS

Baile Chen et al., "SWIR/MWIR InP-Based p-i-n Photodiodes with InGaAs/GaAsSb Type-II Quantum Wells," IEEE Journal of Quantum Electronics, Sep. 2011, pp. 1244-1250, vol. 47, No. 9.
(Continued)

*Primary Examiner* — Samuel Gebremariam
(74) *Attorney, Agent, or Firm* — Drinker Biddle & Reath LLP

(57) ABSTRACT

A semiconductor device and the like having high quantum efficiency or high sensitivity in a near-infrared to infrared region is provided. The semiconductor device includes: a substrate; a multiple quantum well structure disposed on the substrate, and including a plurality of pairs of a layer a and a layer b; and a crystal-adjusting layer disposed between the substrate and the multiple quantum well structure. The crystal-adjusting layer includes a first adjusting layer which is made of the same material as the substrate and is in contact with the substrate, and a second adjusting layer which is
(Continued)

made of the same material as the layer a or the layer b of the multiple quantum well structure and is in contact with the multiple quantum well structure.

14 Claims, 4 Drawing Sheets

(51) Int. Cl.
*H01S 5/343* (2006.01)
*H01L 27/146* (2006.01)
*H01L 31/0304* (2006.01)
*H01L 31/109* (2006.01)
*H01L 31/18* (2006.01)
*H01S 5/042* (2006.01)
*H01S 5/30* (2006.01)
*H01S 5/34* (2006.01)

(52) U.S. Cl.
CPC ...... *H01L 31/03046* (2013.01); *H01L 31/109* (2013.01); *H01L 31/1844* (2013.01); *H01S 5/34306* (2013.01); *H01S 5/0425* (2013.01); *H01S 5/305* (2013.01); *H01S 5/3422* (2013.01); *H01S 2301/173* (2013.01)

(56) References Cited

FOREIGN PATENT DOCUMENTS

| JP | 2011-054915 A | 3/2011 |
| JP | 2011-060792 A | 3/2011 |
| JP | 2011-222874 A | 11/2011 |
| JP | 2012-038766 A | 2/2012 |
| JP | 2012-216727 A | 11/2012 |
| WO | WO-2011/016309 A1 | 2/2011 |
| WO | WO-2011/027624 A1 | 3/2011 |

OTHER PUBLICATIONS

Rubin Sidhu et al., "A Long-Wavelength Photodiode on InP Using Lattice-Matched GaInAs-GaAsSb Type-II Quantum Wells," IEEE Photonics Technology Letters, Dec. 2005, pp. 2715-2717, vol. 17, No. 12.

M. Peter et al., "Light-emitting diodes and laser diodes based on a $Ga_{1-x}In_xAs/GaAs_{1-y}Sb_y$ type II superlattice on InP substrate," Applied Physics Letters, Apr. 5, 1999, pp. 1951-1953, vol. 74, No. 14.

* cited by examiner

↑ LIGHT

⇧ LIGHT

TYPE OF CRYSTAL-ADJUSTING LAYER
(FIRST ADJUSTING LAYER/SECOND ADJUSTING LAYER)

SEMICONDUCTOR DEVICE AND METHOD FOR MANUFACTURING THE SAME

TECHNICAL FIELD

The present invention relates to a semiconductor device and a method for manufacturing the semiconductor device. More specifically, the invention relates to a semiconductor device having a bandgap energy corresponding to a near-infrared to infrared region, and a method for manufacturing the semiconductor device.

BACKGROUND ART

III-V compound semiconductors such as InP have bandgap energies corresponding to the near-infrared to infrared region, and hence are studied for development of photodiodes for communications, biomedical examinations, image capturing at night, and the like. Absorption spectra of substances relating to living bodies and environments are in the near-infrared to infrared wavelength region. Therefore, expansion of sensitivity of the photodiodes using InP and the like to a long-wavelength region has been an important theme. For example, NON PATENT LITERATURE 1 proposes a mesa-type single-pixel photodiode including an absorption layer having an InGaAs/GaAsSb type-II multiple quantum well (MQW) structure on an InP substrate, in order to improve sensitivity in the long-wavelength region. In this photodiode, an InGaAs buffer is disposed on an InP substrate, and the InGaAs/GaAsSb type II multiple quantum well structure is disposed on the buffer. This mesa-type single-pixel photodiode has a cutoff wavelength of 2.39 µm. Sensitivity characteristics at wavelengths from 1.7 to 2.7 µm are demonstrated.

Meanwhile, a photodiode including an array of a plurality of pixels (absorption portions) is used in image pickup devices and the like. PATENT LITERATURES 1 and 2 each propose a planar photodiode in which pixels are formed by introducing an impurity by selection diffusion. In the photodiode, the above-mentioned InGaAs/GaAsSb type II multiple quantum well structure is used, and a semiconductor layered structure is appropriately modified to prevent the multiple quantum well structure from being deteriorated by the impurity. By using such a layered structure, it is possible to provide a photodiode including an array of pixels having sensitivity in the near-infrared to infrared region.

Meanwhile, NON PATENT LITERATURE 2 proposes LEDs and laser diodes having an emission wavelength of 2.14 µm, in which an InGaAs/GaAsSb type II MQW is formed as an active layer on an InP substrate. The type II MQW is grown at a temperature of 530° C. by metal-organic vapor phase epitaxy (MOVPE). As sources of InGaAs and GaAsSb, metal-organic gases thereof are disclosed.

CITATION LIST

Patent Literature

[PATENT LITERATURE 1] Japanese Laid-Open Patent Publication No. 2009-206499
[PATENT LITERATURE 2] Japanese Laid-Open Patent Publication No. 2011-54915

Non Patent Literature

[NON PATENT LITERATURE 1] R. Sidhu, et. al. "A Long-Wavelength Photodiode on InP Using Lattice-Matched GaInAs—GaAsSb Type-II Quantum Wells", IEEE Photonics Technology Letters, Vol. 17, No. 12 (2005), pp. 2715-2717
[NON PATENT LITERATURE 2] M. Peter, et. al. "Light-emitting diodes and laser diodes based on a $Ga_{1-x}In_xAs/GaAs_{1-y}Sb_y$ type II superlattice on InP substrate", Appl. Phys. Lett., Vol. 74, No. 14 (5 Apr. 1999), pp. 1951-1953

SUMMARY OF THE INVENTION

Problems to be Solved by the Invention

Since light in the near-infrared to infrared region has low energy and is significantly influenced by environmental temperature, dark current must be reduced particularly in photodiodes. Therefore, it has been recognized that it is important to reduce the dark current by improving crystallinity. However, it is no less important to improve sensitivity or quantum efficiency. In conventional semiconductor devices including the above-mentioned photodiodes, sufficient attention has not been paid to maximization of sensitivity or quantum efficiency, whereas great attention has been paid to reduction of dark current.

An object of the present invention is to provide a semiconductor device and a method for manufacturing the semiconductor device, which can improve sensitivity or quantum efficiency in the near-infrared to infrared region.

Solution to the Problems

A semiconductor device according to the present invention includes a III-V semiconductor substrate, a multiple quantum well structure disposed on the substrate and including a plurality of pairs of a layer a and a layer b, and a crystal-adjusting layer disposed between the substrate and the multiple quantum well structure. The crystal-adjusting layer includes a first adjusting layer which is made of the same material as the substrate and is in contact with the substrate, and a second adjusting layer which is made of the same material as the layer a or the layer b in the multiple quantum well structure.

Advantageous Effects of the Invention

According to the semiconductor device and the like of the present invention, it is possible to improve quantum efficiency in the near-infrared to infrared region.

DESCRIPTION OF EMBODIMENTS

Figure 1:
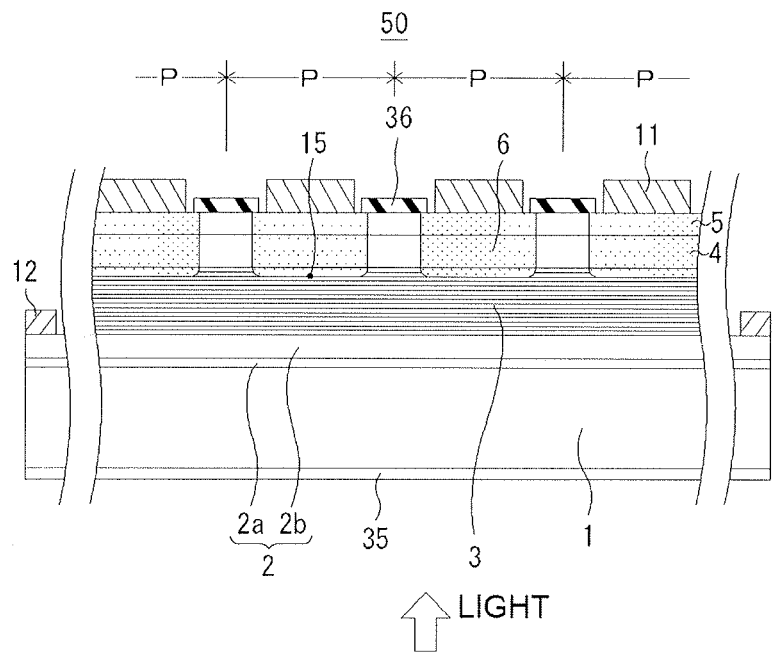
FIG. 1 is a sectional view for explaining a photodiode according to an embodiment of the present invention.

List of Examples of Embodiments of Present Invention

First, description will be given of examples of embodiments of the present invention relating to 1. semiconductor device, 2. epitaxial wafer, 3. method for manufacturing the semiconductor device or the epitaxial wafer.

1. Semiconductor Device

A semiconductor device according to the present embodiment includes: a III-V semiconductor substrate; a multiple quantum well (MQW) structure disposed on the substrate and including a plurality of pairs of a layer a and a layer b; and a crystal-adjusting layer disposed between the substrate and the multiple quantum well structure. The crystal-adjusting layer includes: a first adjusting layer that is made of the same material as the substrate and is in contact with the substrate; and a second adjusting layer that is made of the same material as the layer a or the layer b of the multiple quantum well structure. According to the above configuration, the first adjusting layer, of the crystal-adjusting layer, is made of the same material as the substrate. Therefore, impurities such as oxygen which are attached to the surface of the substrate and distributed at high concentrations are embedded in the first adjusting layer, whereby influences of oxygen and the like are eliminated. In addition, depressions and projections at the surface of the substrate are embedded in the first adjusting layer to make the surface flat. The second adjusting layer made of the same material as the layer a or the layer b of the absorption layer is epitaxially grown on the first adjusting layer. Thereby, the second adjusting layer serves as a preferable base layer that improves crystallinity of the absorption layer. It is possible to improve sensitivity of the photodiode by the functions of these crystal-adjusting layers.

(1) Substrate

Examples of the substrate may include: an InP substrate, a GaSb substrate, a GaAs substrate, a GaP substrate, an InAs substrate, an InSb substrate, an AlSb substrate, an AlAs substrate, and the like. Depending on the configuration of the semiconductor device, the substrate may be doped with a first conductivity type dopant, or may be doped with a high-resistivity dopant. Alternatively, the substrate may be non-doped. For example, in the case of an InP substrate, an Fe-doped semi-insulating InP substrate has improved transmittance in the near-infrared to infrared region as compared to an S-doped n-type InP substrate. However, there are cases where the transmittance in the near-infrared to infrared region is improved even when the substrate includes the first conductivity type dopant. In the case of a GaSb substrate, a GaSb substrate doped with tellurium (Te) as an n-type impurity has improved transmittance in the near-infrared to infrared region as compared to a GaSb substrate that is intentionally non-doped and consequently exhibits p-type conductivity. On the other hand, in the case where a substrate is not doped with a conductive dopant, choices of substrate types can be increased. For example, a substrate having a thickness greater than the wavelength of target light need not be doped with a predetermined level or more of a first conductivity type dopant to increase free carriers. Therefore, in a substrate-rear-illuminated type photodiode, light is prevented from being absorbed by free carriers in the substrate, and quantum efficiency or sensitivity is significantly improved as compared to a substrate containing free carriers.

(2) Epitaxial Layer/Substrate Interface

A so-called epitaxial layer/substrate interface is formed between the first adjusting layer of the crystal-adjusting layer and the substrate. While the first adjusting layer is grown on the surface of the substrate, the epitaxial layer/substrate interface allows the first adjusting layer to be identified as an independent layer grown on the substrate. The epitaxial layer/substrate interface is an interface between a crystalline layer and a semiconductor substrate, which is formed as follows, for example. That is, a surface of a cut-out semiconductor substrate is subjected to cleaning and flattening by etching. Then, the substrate is once exposed to the atmosphere, and again subjected to surface-adjustment by etching or the like. Then, the crystalline layer is grown in contact with the substrate. Usually, oxygen and carbon are mixed into the interface as impurities at high concentrations. The epitaxial layer/substrate interface satisfies at least one of the oxygen concentration of $1 \times 10^{17}$ cm$^{-3}$ or more and the carbon concentration of $1 \times 10^{17}$ cm$^{-3}$ or more. The oxygen concentration or the like in an ordinary semiconductor layer is $5 \times 10^{16}$ cm$^{-3}$ or less.

(3) Crystal-Adjusting Layer

The crystal-adjusting layer is disposed between the substrate and the multiple quantum well structure, and can also be regarded as a buffer layer. The first adjusting layer, of the crystal-adjusting layer, is made of the same material as the substrate. Therefore, impurities such as oxygen which are attached to the surface of the substrate and distributed at high concentrations are embedded in the first adjusting layer, whereby influences of oxygen and the like are eliminated. In addition, depressions and projections at the surface of the substrate are embedded in the first adjusting layer to make the surface flat. The second adjusting layer made of the same material as the layer a or the layer b of the absorption layer is epitaxially grown on the first adjusting layer. Thereby, the second adjusting layer serves as a preferable base layer that improves crystallinity of the absorption layer. In addition, deterioration of crystallinity caused by improper surface morphology of the substrate such as foreign substances can be suppressed by the crystal-adjusting layer. It is possible to improve sensitivity of the photodiode by the functions of these crystal-adjusting layers.

(i) Thickness of Crystal-Adjusting Layer

The surface of the substrate is thoroughly cleaned by etching or the like, and thereafter, the crystal-adjusting layer is grown on the substrate. At this time, improper surface morphology, the source of which is not enough known, such as surface portions collectively referred by a term "foreign substances" may exist. For example, foreign substances having an average diameter of 5 μm or less may be dispersed on the substrate at an average density of 0.05 pieces/cm$^2$ to 0.5 pieces/cm$^2$. The foreign substances dispersed on the substrate can be observed on the epitaxial wafer with energy dispersive X-ray spectroscopy (EDX), Auger electron spectroscopy (AES), scanning electron microscope (SEM), analytical SEM, or the like, and the density thereof can be measured. Such improper surface morphology causes deterioration of crystallinity, and increase in dark current. The deterioration of crystallinity may cause projections at the surface of the epitaxial wafer, which may cause reduction in product yield. For example, when the total thickness of the crystal-adjusting layer is about 160 nm or more, the foreign substances can be completely or partially embedded in the crystal-adjusting layer, whereby deterioration of crystallinity is avoided, and expansion of crystal defects is suppressed.

The crystal-adjusting layer includes the first adjusting layer and the second adjusting layer, and the thickness of the first adjusting layer may be ⅕ or less of the thickness of the second adjusting layer. Since the substrate is often made of a material that absorbs light in the near-infrared to infrared region, it is reasonable to form the first adjusting layer thin. Further, the second adjusting layer made of the same material as the layer a or the layer b of the absorption layer is epitaxially grown relatively thick, whereby the second adjusting layer serves as a favorable base layer that improves crystallinity of the absorption layer. Regarding the relationship in thickness range between the first adjusting layer and the second adjusting layer, the thickness of the first adjusting layer is more preferably 1/10 or less of the thickness of the second adjusting layer, and still more preferably, 1/20 or less. Specifically, it is possible to show a case where the thickness of the first adjusting layer is not less than 10 nm but not more than 60 nm, and the thickness of the second adjusting layer is 150 nm or more, for example, 300 nm. Since absorption of light by the substrate often extends into the near-infrared to infrared region, absorption by the first adjusting layer made of the same material as the substrate can be suppressed. If the first adjusting layer contains a dopant at a high concentration, the thickness thereof is reduced as described above. Thereby, even when a substrate-rear-illuminated type photodiode is configured, the thickness of the first adjusting layer is significantly less than the wavelength of target light and absorption of light due to free carriers can be avoided. As a result, quantum efficiency or sensitivity can be improved.

(ii) Dopant of Crystal-Adjusting Layer

The crystal-adjusting layer may contain a first conductivity type dopant, or may be non-doped. In the crystal-adjusting layer, the first conductivity type dopant concentration in the first adjusting layer may be higher than the first conductivity type dopant concentration in the second adjusting layer. In this case, the first adjusting layer that contains the dopant at the high concentration can suppress adverse effects of impurities (impurities at the substrate/epitaxial-layer interface) that have been attached to the substrate due to exposure of the substrate to the atmosphere before growth of the epitaxial layer. Before growth of the epitaxial layer, the surface of the substrate is subjected to wet etching or the like to remove deposits such as fine particles, and processed layers from the surface. However, when the substrate, which has been subjected to the wet etching, drying, and other processes, is carried into a growth chamber, the substrate is unavoidably exposed to the atmosphere. Therefore, it is usual that oxygen (oxide) and carbon remain at high concentrations on the surface of the substrate. It is known by secondary ion mass spectrometry or the like that, at such an epitaxial layer/substrate interface, at least one of the oxygen concentration of $1\times10^{17}$ $cm^{-3}$ or more and the carbon concentration of $1\times10^{17}$ $cm^{-3}$ or more is satisfied. The first adjusting layer having the high concentration of the first conductivity type dopant forms an epitaxial layer/substrate interface with the substrate. By growing the first adjusting layer containing the first conductivity type dopant at the high concentration on the surface of the substrate on which deposits such as oxide are attached, it is possible to suppress adverse effects of the deposits. The deposits deteriorate crystallinity of the multiple quantum well, and degrade flatness of the interface of each layer in the multiple quantum well. Although it is unknown what mechanism improves quantum efficiency of the semiconductor device, it is highly likely that the interfaces in the multiple quantum well being flattened are effective. It is predicted, from improved crystallinity, that suppressing the adverse effects by the first adjusting layer results in reduction in dark current when photodiodes are formed. Therefore, sensitivity is improved, and dark current is further reduced.

Further, the first conductivity type dopant concentration in the first adjusting layer may be 5 times or more of the first conductivity type dopant concentration in the second adjusting layer. Thereby, the function of the first adjusting layer to suppress the adverse effects of deposits at the epitaxial layer/substrate interface can be enhanced. As specific examples of the first conductivity type dopant concentrations, for example, the first conductivity type dopant concentration in the first adjusting layer may be not lower than $1\times10^{17}$ $cm^{-3}$ but not higher than $8\times10^{18}$ $cm^{-3}$, and the first conductivity type dopant concentration in the second adjusting layer may be not lower than $7\times10^{16}$ $cm^{-3}$ but not higher than $8\times10^{17}$ $cm^{-3}$. Since the second adjusting layer is thicker than the first adjusting layer as described above, if the dopant concentration thereof is high (e.g., about $1\times10^{18}$ $cm^{-3}$), absorption due to free carriers increases, which may lead to reduction in sensitivity. It is noted that the dopant materials with which the first adjusting layer and the second adjusting layer are doped may be the same or different from each other as long as they are first conductivity type dopants.

(4) First Conductivity Side Electrode (i) The semiconductor device according to the present embodiment may further include a first conductivity side electrode, and the first conductivity side electrode (ground electrode) may be in ohmic contact with the crystal-adjusting layer. In this case, the substrate may contain a dopant that makes the substrate have high resistivity, the crystal-adjusting layer may contain a first conductivity type dopant, and the pixels may include a second conductivity type region. When the substrate has high resistivity, no first conductivity side electrode is disposed on the rear surface of the substrate. When the first conductivity side electrode is disposed on the crystal-adjusting layer, the first conductivity side electrode should be in ohmic contact with the crystal-adjusting layer. The first conductivity side electrode can be brought into ohmic contact with the first adjusting layer or the second adjusting layer of the crystal-adjusting layer.

(a1) When the first conductivity side electrode is brought into ohmic contact with the second adjusting layer, at least the second adjusting layer is made to contain the dopant in the crystal-adjusting layer. Since the second adjusting layer has the large thickness in the crystal-adjusting layer, it is preferable to dispose the first conductivity side electrode on the second adjusting layer. When the first conductivity side electrode is disposed on the second adjusting layer, the first adjusting layer becomes independent of a voltage path for applying a reverse bias voltage to a p-i-n junction or a p-n junction. Therefore, the first adjusting layer may be doped with the first conductivity type dopant, or may be non-doped. In the case where the first adjusting layer is doped with the first conductivity type dopant, if the first conductivity type dopant concentration in the first adjusting layer is higher than the first conductivity type dopant concentration in the second adjusting layer, adverse effects of deposits at the epitaxial layer/substrate interface between the first adjusting layer and the substrate can be suppressed, whereby further reduction in dark current and further improvement of sensitivity can be expected.

(a2) When the first conductivity side electrode is brought into contact with the first adjusting layer, the first conductivity type dopant concentration in the first adjusting layer of the crystal-adjusting layer may be higher than the first conductivity type dopant concentration in the second adjusting layer thereof. In this case, since the dopant concentration in the first adjusting layer is high, it is preferable to bring the first conductivity side electrode into ohmic contact with the first adjusting layer. Further, by growing the first adjusting layer containing the first conductivity type dopant at a high concentration on the substrate surface to which deposits such as oxide are attached, adverse effects of the deposits can be suppressed. Therefore, when photodiodes are formed, sensitivity is further improved and dark current is suppressed.

Although it is preferable, for achieving ohmic contact, to bring the first conductivity side electrode into contact with the first adjusting layer that contains the first conductivity type dopant at a high concentration, the thickness of the first adjusting layer is much smaller than that of the second adjusting layer in many cases. As a countermeasure to this problem, it is desirable that the first adjusting layer and the second adjusting layer are made of different materials, and a selective etchant that etches the second adjusting layer but does not etch the first adjusting layer is used in the process of forming the first conductivity side electrode. The second adjusting layer is removed with the etchant, and thereafter, the first conductivity side electrode is formed in contact with the first adjusting layer. For example, when the first adjusting layer/the second adjusting layer are InP/InGaAs, an etchant having a composition of phosphoric acid (85%): hydrogen peroxide solution (30%):water=1:1:4 is used. With this etchant, the surface of the InP first adjusting layer can be reliably exposed, and the first conductivity side electrode can be brought into ohmic contact with the InP first adjusting layer.

(ii) The first conductivity side electrode (rear surface electrode) may be in ohmic contact with the rear surface of the substrate. In this case, the substrate is doped with a first conductivity type dopant with the pixels having the second conductivity type. A power supply voltage required for applying a reverse bias voltage to the p-i-n junction or the p-n junction can be reduced when the crystal-adjusting layer is doped with the first conductivity type dopant. However, the crystal-adjusting layer may be non-doped to make the crystal-adjusting layer intrinsic. When the crystal-adjusting layer is made to have the first conductivity, the dopant of the crystal-adjusting layer may be different from the dopant of the substrate. The reason is because the first conductivity type dopant suitable for growth of the substrate is different from the first conductivity type dopant suitable for growth by MOVPE. For example, while the substrate has a thickness several hundred times the thickness of the first adjusting layer, absorption of light by the substrate may greatly extend into the near-infrared to infrared region, depending on the type of a dopant. It is desirable to avoid the substrate from being doped with such a dopant. However, in the first adjusting layer whose thickness is one several hundredth of the thickness of the substrate, such a dopant does not cause significant reduction in sensitivity. When the crystal-adjusting layer is doped, the first adjusting layer and the second adjusting layer may be doped with the same dopant, or different dopants. In this case, by setting the first conductivity type dopant concentration in the first adjusting layer to be higher than the first conductivity type dopant concentration in the second adjusting layer, it is possible to achieve a function to suppress adverse effects of deposits at the epitaxial layer/substrate interface.

(5) Type of Multiple Quantum Well Structure

The substrate may be any of an InP substrate, a GaSb substrate, and a GaAs substrate, the absorption layer may be a type II multiple quantum well structure, and each pair (a/b) may be (InGaAs/GaAsSb) or (InAs/GaSb). Thus, a semiconductor device including a type II multiple quantum well having a bandgap corresponding to the near-infrared to infrared region can be obtained. It is noted that the InGaAs is $In_xGa_{1-x}As$ ($0.38 \leq x \leq 1$), and the GaAsSb is $GaAs_{1-y}Sb_y$ ($0.36 \leq y \leq 1$). Besides the above-mentioned substrates, a GaP substrate, an InAs substrate, an InSb substrate, an AlSb substrate, an AlAs substrate, and the like may be used.

(6) Products Using Semiconductor Device

The semiconductor device may be a photodiode including an multiple quantum well structure as an absorption layer. Thus, a photodiode having high sensitivity in the near-infrared to infrared region can be obtained. This photodiode may be combined with a read-out circuit to obtain an optical sensor device such as an image pickup device. The semiconductor device may be a laser or alight emitting diode (LED) which emits light in the near-infrared to infrared region. Various kinds of light-emitting devices may be formed by using the laser and/or the LED.

2. Epitaxial Wafer

The epitaxial wafer of the present invention is an epitaxial wafer used for any of the above-mentioned photodiodes, and including a III-V semiconductor substrate and a semiconductor layered structure on the substrate.

3. Method for Manufacturing Semiconductor Device or Epitaxial Wafer

A method for manufacturing a semiconductor device according to an embodiment of the present invention is a method for manufacturing a semiconductor device by metal-organic vapor phase epitaxy (MOVPE). This manufacturing method includes a step of growing a crystal-adjusting layer on and in contact with a III-V semiconductor substrate, and a step of growing, in contact with the crystal-adjusting layer, a type II multiple quantum well (MQW) structure including a plurality of pairs of a layer a and a layer b. In the crystal-adjusting layer growth step, the crystal-adjusting layer is composed of a first adjusting layer and a second adjusting layer. The first adjusting layer, made of the same material as the substrate, is grown in contact with the substrate. The second adjusting layer, made of the same material as the layer a or the layer b, is grown on the first adjusting layer, in contact with a lower surface of the multiple quantum well structure. Thus, a semiconductor device having sufficiently high quantum efficiency as described above can be efficiently manufactured by metal-organic vapor phase epitaxy. The above-mentioned semiconductor device or epitaxial wafer can be manufactured by a commercially available metal-organic vapor phase epitaxy apparatus, using source gases ordinary used therein. Preferably, metal-organic vapor phase epitaxy using only metal-organic sources may be used to manufacture a semiconductor device or epitaxial wafer having more improved crystallinity.

(1) Metal-Organic Vapor Phase Epitaxy (MOVPE)

MOVPE is less likely to be restricted by the size of a substrate, and is suitable for efficiently forming a semiconductor device having good crystallinity. The semiconductor device or the epitaxial wafer therefor according to the present embodiment may be grown by any growth method, but it is preferable to growth them by MOVPE for the above reasons. MOVPE uses phosphine ($PH_3$), which is an inorganic source, as a source of phosphorus, and arsine ($AsH_3$) as a source of As (arsenic). Metal-organic vapor phase epitaxy using only metal-organic sources is an MOVPE method in which all source gases for film deposition are metal-organic gases. In this embodiment, a difference from ordinary metal-organic vapor phase epitaxy appears in the sources for growth of III-V semiconductor layers including phosphorus (P). A difference between metal-organic vapor phase epitaxy using only metal-organic sources and ordinary metal-organic vapor phase epitaxy clearly appears in that, as a source of phosphorus, the former uses tertiarybutylphosphine (TBP) while the latter uses phosphine ($PH_3$) as an inorganic source.

(2) Layer Containing Phosphorus (P)

Of course, a layer containing P can be grown by MOVPE. That is, for example, an InP window layer and an InP first adjusting layer can be grown by using a commercially available MOVPE growth apparatus and commercially available source gases. However, according to metal-organic vapor phase epitaxy using only metal-organic sources, since TBP (tertiarybutylphosphine) is used as a source of phosphorus and decomposed at a lower temperature than phosphine ($PH_3$) as an inorganic source, low-temperature deposition is realized. Such low temperature deposition is effective for embedding of impurities such as oxygen at the surface of the InP substrate and for gentle flattening of depressions and projections.

(3) Type II (InGaAs/GaAsSb) Multiple Quantum Well Structure

A photodiode using an InP substrate often includes an InP layer as a window layer at the top of a semiconductor layered structure including a type II (InGaAs/GaAsSb) MQW structure and the like. In this case, for example, the InP window layer can be grown by MOVPE using phosphine ($PH_3$) as a source of phosphorus. More preferably, by metal-organic vapor phase epitaxy using only metal-organic sources, the InP window layer can be grown at a low temperature by using TBP. Therefore, an absorption layer having good crystallinity can be obtained without inducing thermal damage to GaAsSb in the absorption layer disposed beneath the InP window layer.

<Details of Embodiment of Present Invention>

Hereinafter, specific examples of the epitaxial wafer and the like according to the embodiment of the present invention will be described with reference to the drawings. It is noted that the present invention is not limited to the examples, and the scope of the present invention is defined in the appended claims and includes equivalence of the description of the claims and all changes within the scope of the claims.

FIG. 1 is a sectional view of a photodiode (planar photodiode) 50 according to a specific example of the embodiment of the present invention. The photodiode 50 is formed in an epitaxial wafer shown in FIG. 2. An interface between a first adjusting layer 2a and an InP substrate 1 is an epitaxial layer/substrate interface 18.

(InP substrate 1/crystal-adjusting layer 2 (first adjusting layer 2a/second adjusting layer 2b)/type II (InGaAs/GaAsSb) multiple quantum well (MQW) absorption layer 3/InGaAs diffusive-concentration-distribution-adjusting layer 4/InP window layer 5)

Figure 2:
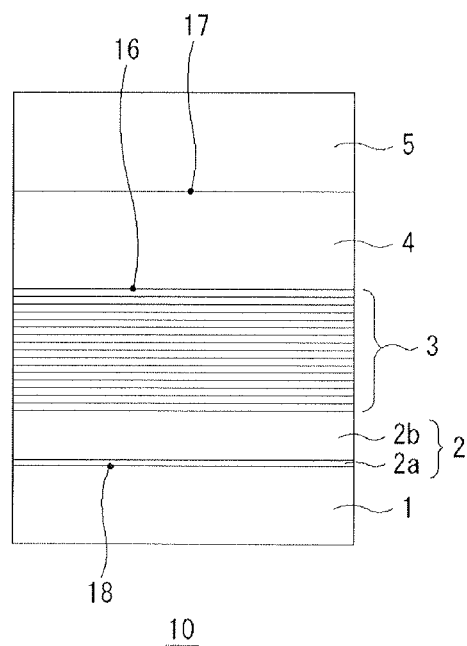
FIG. 2 is a schematic view of an epitaxial wafer according to the embodiment of the present invention.
Figure 3:
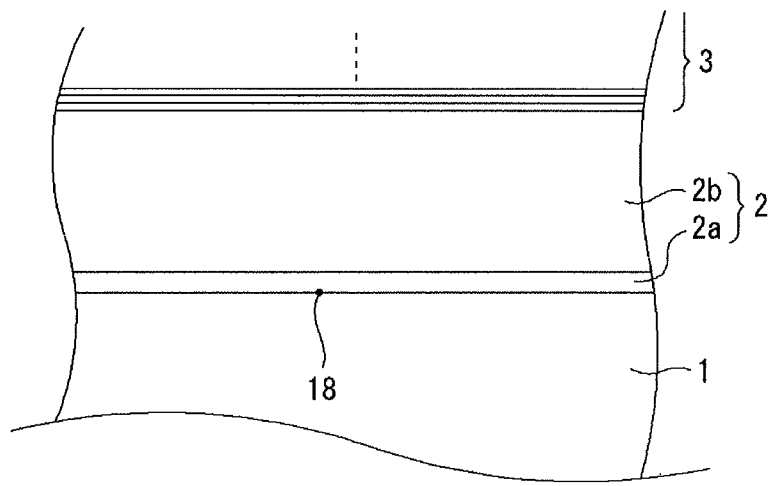
FIG. 3 is a partially enlarged view of a crystal-adjusting layer in the epitaxial wafer shown in FIG. 2.

As shown in FIGS. 1 to 3 and the like, the crystal-adjusting layer 2 is formed of a composite layer of an InP first adjusting layer 2a and an InGaAs second adjusting layer 2b. The InGaAs second adjusting layer 2b is doped with an n-type impurity (first conductivity type dopant), and a first conductivity side electrode 12 (also referred to as a ground electrode or an n-electrode) is in ohmic contact with the second adjusting layer 2b. The total thickness of the crystal-adjusting layer 2 is 160 nm or more. If foreign substances, the source of which cannot be specified, are dispersed in the substrate immediately before growth of the crystal-adjusting layer 2 in a thin-film growth chamber, the foreign substances are partially or completely embedded in the crystal-adjusting layer 2, whereby crystallinity of the absorption layer 3 having the type II multiple quantum well structure, which is disposed on the crystal-adjusting layer 2, can be retained. In particular, it is possible to suppress growth of coarse projections (having a diameter exceeding 30 μm) which may be formed at the surface of the window layer 5. Specifically, the thickness of the InP first adjusting layer 2a is not less than 10 nm but not more than 60 nm. The thickness of the InGaAs second adjusting layer 2b is not less than 150 nm. The thickness of the InP first adjusting layer 2a is ⅕ or less of the thickness of the InGaAs second adjusting layer 2b.

Pixels P of the photodiode 50 are arrayed in an matrix at a pitch of 30 μm, for example, and provide an image of light in the near-infrared to infrared region. A main part of each pixel P is formed of a p-type region 6. The p-type regions are formed by selectively diffusing zinc (Zn) serving as a p-type impurity from the surface of the window layer 5 exposed in openings of a selective diffusion mask pattern 36. Each pixel P is separated from adjacent pixels P by regions that are not subjected to the selective diffusion, whereby independence of the pixel P is secured. At an end of the p-type region 6 of each pixel P, a p-n junction 15 or a p-i junction (a p-i-n junction when viewed in a broader range including the first conductivity side electrode) is formed. No impurity is doped in the absorption layer 3 to make the absorption layer 3 intrinsic, thereby providing a p-i-n junction. However, impurities (e.g., n-type impurity) are inevitably contained at a low concentration in the absorption layer 3. Therefore, even though the photodiode 50 is regarded as a p-i-n photodiode, a p-n junction is actually formed at the end of each p-type region. Hereinafter, both the p-i-n junction and the p-n junction are referred to as "p-n junction 15".

In the case where an impurity is selectively diffused into a layered structure such as an absorption layer/a window layer, from the window layer, according to the planar system, if the absorption layer is a type II multiple quantum well structure, crystallinity of the multiple quantum well structure is not resistant against the impurity. Even when the concentration of the impurity is relatively low, crystallinity is deteriorated and dark current is significantly increased. Therefore, when the p-n junctions 15 are formed, the range of the impurity introduced from the window layer 5 should be kept within an upper portion of the InP window layer 5 or within the diffusive-concentration-distribution-adjusting layer 4 to control the impurity concentration in the multiple quantum well structure strictly to be low.

In order to solve the above problem, the diffusive-concentration-distribution-adjusting layer 4 is disposed between absorption layer 3 having the type II multiple quantum well structure, and the window layer 5. The carrier concentration of the selectively diffused impurity needs to be distributed at a high level in the window layer which needs to be in ohmic contact with pixel electrodes. However, the carrier concentration needs to be sharply decreased stepwise in the diffusive-concentration-distribution-adjusting layer 4. By sharply decreasing the carrier concentration stepwise, the carrier concentration is caused to intersect background concentration of opposite conductivity type carriers in the diffusive-concentration-distribution-adjusting layer 4, or caused to intersect background concentration of opposite conductivity type carriers in the multiple quantum well in an upper portion of the type II multiple quantum well structure. An intersection point (plane) with the background concentration of the opposite conductivity type carriers forms the pan junction 15. With the above configuration, the impurity concentration distribution in the absorption layer 3 having the type II multiple quantum well structure is strictly controlled, thereby providing a near-infrared-to-infrared photodiode having high sensitivity and suppressed dark current. Since InGaAs used for the diffusive-concentration-distribution-adjusting layer 4 is lower in Zn diffusion rate than InP forming the window layer 5, a portion in which the Zn concentration distribution is sharply decreased is likely to be formed in the InGaAs diffusive-concentration-distribution-adjusting layer 4. Further, the diffusive-concentration-distribution-adjusting layer 4 is preferably made of a material having high electrical conductivity in order to enhance followability to a motion of a moving image or the like.

In manufacturing the photodiode 50, after the epitaxial wafer is formed by layering the above-mentioned III-V semiconductors, a selective diffusion mask pattern 36 is disposed on the InP window layer 5 of the epitaxial wafer, and Zn is selectively diffused to form the p-type regions 6, i.e., the p-n junctions 15. The pixel electrodes 11 and the first conductivity side electrode 12 are also formed in the epitaxial wafer state. In the stage for packaging each photodiode (chip) 50, the epitaxial wafer is diced into individual photodiodes (chips) 50. An anti-reflection (AR) layer 35 is disposed on the rear surface of the substrate to prevent light incident on the rear surface of the substrate from being reflected, thereby improving quantum efficiency or sensitivity.

Figure 4:
FIG. 4 is a diagram showing a state where the photodiode shown in FIG. 1 waits for light to enter.
Figure 4:
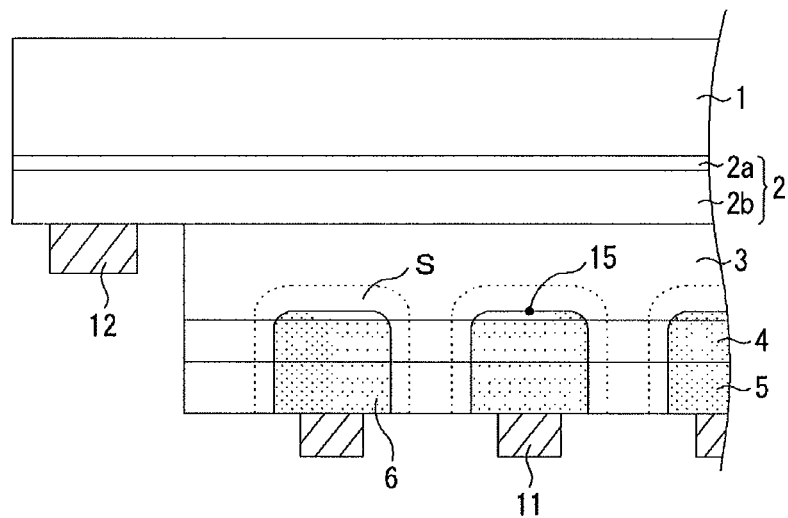

FIG. 4 is a diagram showing a light-reception waiting state in which the photodiode 50 waits for target light to enter. When a reverse bias voltage is applied to the p-n junctions 15 by the pixel electrodes 11 and the common ground electrode 12, a depletion layer S of each pixel P expands into the absorption layer 3, whereby the photodiode 50 enters the light-reception waiting state. When light enters the depletion layer S of a certain pixel P, electron-hole pairs are generated, and the holes drift to the pixel electrode 11 while the electrons drift to the ground electrode 12. Electric charges stored in the pixel electrode 11 are read out at a constant time pitch, and intensity distribution of absorption signals is formed over the pixels to obtain an image. In this case, a reverse bias voltage is applied to the p-n junctions 15 through a voltage path formed by the ground electrode 12, the InGaAs second adjusting layer 2b, the intrinsic-type or low n-type absorption layer 3, the p-type regions 6, and the pixel electrodes 11. Therefore, the InGaAs second adjusting layer 2b needs to contain the n-type impurity. The first adjusting layer 2a and the InP substrate 1 need not be conductive, and may contain optimum impurities depending on their roles, or may be non-doped. For example, when the n-type impurity concentration in the first adjusting layer 2a is higher than the n-type impurity concentration in the InGaAs second adjusting layer 2b, adverse effects of deposits at the epitaxial layer/substrate interface can be suppressed, resulting in further improved sensitivity.

Figure 5:
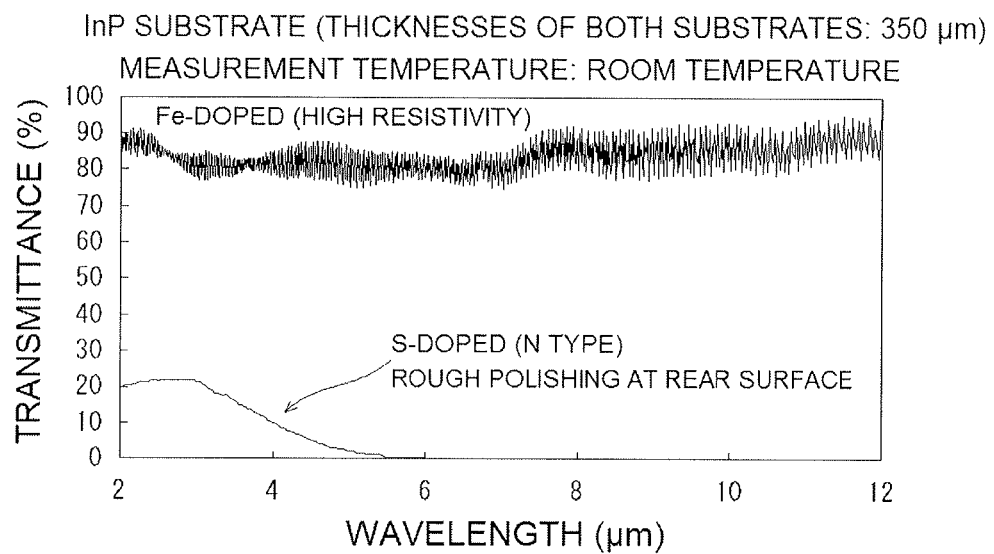
FIG. 5 is a diagram showing transmittance of an InP substrate in an infrared region.

Regarding the InP substrate 1, for example, as shown in FIG. 5, a semi-insulating or high-resistivity iron (Fe)-doped InP substrate is preferable in order to improve transmittance of light in the near-infrared to infrared region. FIG. 5 also shows transmittance, in the near-infrared to infrared region, of a sulfur (S)-doped InP substrate. In the case of the S-doped InP substrate shown in FIG. 5, influence of rough surface polishing is prominent, and low transmittance in a wavelength range from 2 μm to 3 μm both inclusive is exaggerated. However, decrease in transmittance at wavelengths exceeding 3 μm seems to be caused not by the rough polishing but by the dopant (impurity). Improvement of transmittance is directly related to improvement of sensitivity.

Further, when the substrate is a GaSb substrate, doping the substrate with tellurium (Te) as an n-type impurity is effective for increase in transmittance of light in the near-infrared to infrared region, which is not illustrated. A non-doped GaSb substrate is inevitably subjected to incorporation of p-type impurities and becomes p type. In the non-doped GaSb substrate, transmittance of light is high in the near-infrared region, but tends to sharply decrease at wavelengths exceeding 2.5 μm. Therefore, when the substrate is a GaSb substrate, it is essential to dope the substrate with Te regardless of whether the ground electrode is in ohmic contact with the substrate, in order to ensure high sensitivity in the near-infrared to infrared region.

(Modification 1)

Figure 6:
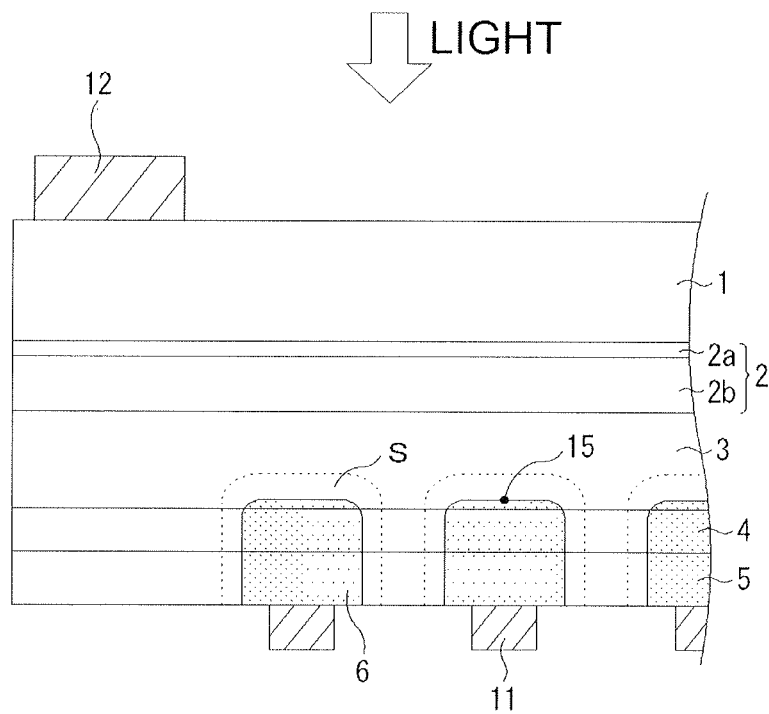
FIG. 6 is a diagram showing a modification of the photodiode shown in FIG. 1, which is an example of the embodiment of the present invention.

FIG. 6 is a diagram showing a modification of the photodiode shown in FIG. 1 or FIG. 4. In Modification 1, the ground electrode 12 is in ohmic contact with the rear surface of the InP substrate. In this structure, in order to apply a reverse bias voltage to the p-n junctions 15 by the ground electrode 12 and the pixel electrodes 11, the InP substrate 1 and the first and second adjusting layers 2a and 2b of the crystal-adjusting layer 2 are disposed in series. It is essential that the InP substrate exhibits the first conductivity, but the crystal-adjusting layer 2 may be of the first conductivity type, or may be intrinsic. When the crystal-adjusting layer 2 is of the first conductivity type, since voltage drop until reaching the p-n junctions 15 is small, the power supply voltage can be advantageously reduced. Further, when the first conductivity type dopant concentration in the first adjusting layer 2a is higher than the first conductivity type dopant concentration in the second adjusting layer 2b, it is possible to achieve a function to suppress adverse effects of deposits at the epitaxial layer/substrate interface. The InP substrate 1 is preferably doped with sulfur (S) when the rear electrode is disposed thereon. S doping does not cause significant reduction in transmittance, in the near-infrared region, as compared to Fe doping.

Modification 1 shown in FIG. 6 is different from the structure shown in FIG. 1 or FIG. 4 in the following points. That is, in Modification 1 shown in FIG. 6, the voltage path on the ground electrode 12 side for applying the reverse bias voltage to the p-n junctions 15 surely includes the InP substrate 1. Therefore, the power supply voltage required to apply a sufficiently great reverse bias voltage to the p-n junctions 15 tends to be increased because the thickness of the InP substrate 1 is greater than the thickness of the second adjusting layer 2b.

(Modification 2)

Figure 7:
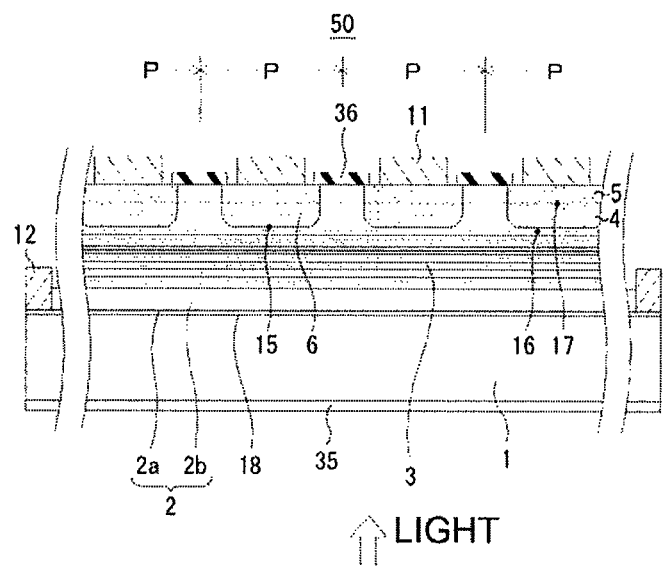
FIG. 7 is a diagram showing another modification of the photodiode shown in FIG. 1, which is an example of the embodiment of the present invention.

FIG. 7 is a diagram showing another modification of the photodiode shown in FIG. 1 or FIG. 4. In Modification 2, the InP first adjusting layer 2a of the crystal-adjusting layer 2 contains silicon (Si) having a high concentration, e.g., $1\times10^{18}$ cm$^{-3}$ as a first conductivity type dopant, and has a thickness of 30 nm (0.03 μm). The InGaAs second adjusting layer 2b contains Si having a lower concentration, e.g., $1\times10^{17}$ cm$^{-3}$, and has a thickness of 300 nm (0.3 μm). The thickness of the InP first adjusting layer 2a is ⅕ or less of the thickness of the InGaAs second adjusting layer 2b, and is 1/10 in this embodiment. The ground electrode 12 is in ohmic contact with the InP first adjusting layer 2a. Therefore, in this structure, a reverse bias voltage is applied to the p-n junctions 15 through a voltage path formed by the ground electrode 12, the InP first adjusting layer 2a, the InGaAs second adjusting layer 2b, the intrinsic-type or low n-type absorption layer 3, the p-type regions 6, and the pixel electrodes 11. Therefore, the InP first adjusting layer 2a contains an n-type impurity at a high concentration. However, the InP substrate 1 need not be conductive, and may contain an optimum impurity depending on its role, or may be non-doped.

In Modification 2, the first conductivity type dopant concentration in the first adjusting layer of the crystal-adjusting layer is higher than the first conductivity type dopant concentration in the second adjusting layer thereof. Since the first adjusting layer containing the first conductivity type dopant at a high concentration is grown on the substrate surface to which deposits such as oxide are attached, adverse effects of the deposits can be suppressed. Thus, deterioration of crystallinity of the multiple quantum well and degradation of flatness of the interface of each layer in the multiple quantum well can be suppressed, whereby quantum efficiency of the semiconductor device is improved, and sensitivity is further improved and dark current is suppressed when photodiodes are formed.

After the epitaxial wafer 10 has been manufactured, introduction of Zn is performed by the above-mentioned selective diffusion to form pixels P each being separated from adjacent pixels by regions not subjected to the selective diffusion. Thereafter, p-electrodes serving as the pixel electrodes 11 and an n-electrode serving as the ground electrode 12 common to the respective pixels are formed. In the formation of the ground electrode 12, the multiple quantum well 3 is removed by etching at a predetermined peripheral portion of the epitaxial wafer 10 to expose the crystal-adjusting layer 2. Thereafter, a resist mask pattern having an opening corresponding to a planar position of the ground electrode 12 is formed, and the InGaAs second adjusting layer 2b is etched off with the above-mentioned etchant having a composition of phosphoric acid (85%):hydrogen peroxide solution (30%):water=1:1:4. That is, the InGaAs is etched and the InP is caused to function as an etch stop layer. In this way, when the first adjusting layer/the second adjusting layer are InP/InGaAs, the etchant having the composition of phosphoric acid (85%):hydrogen peroxide solution (30%):water=1:1:4 is used. Thereby, the surface of the first adjusting layer InP can be reliably exposed, and the first conductivity (n) side electrode can be easily brought into ohmic contact with the InP first adjusting layer. AuGeNi or the like may be used for the n-electrode 12, and AuZn or the like may be used for the p-side pixel electrodes.

The above-mentioned semiconductor device or epitaxial wafer can be manufactured by ordinary MOVPE as described above. That is, the above-mentioned semiconductor device or the like can be manufactured by a commercially available MOVPE growth apparatus, using source gases ordinary used therein. Preferably, metal-organic vapor phase epitaxy using only metal-organic sources may be used to manufacture a semiconductor device or the like having more improved crystallinity. As described above, metal-organic vapor phase epitaxy using only metal-organic sources is a method in which all source gases for film deposition are metal-organic gases. A difference between metal-organic vapor phase epitaxy using only metal-organic sources and ordinary MOVPE clearly appears in that, as a source of phosphorus, the former uses tertiarybutylphosphine (TBP) while the latter uses phosphine ($PH_3$) as an inorganic source.

A method for manufacturing the epitaxial wafer according to the above embodiment by metal-organic vapor phase epitaxy will be described for Modification 1 and Modification 2 as examples. The description will be made with reference to components of a deposition apparatus for metal-organic vapor phase epitaxy. However, since the deposition apparatus is a commercially available apparatus and the mechanism thereof does not play an important role, illustration thereof is omitted.

(Manufacturing Method for Modification 1)

In Modification 1, first, an S-doped n-type InP substrate 1 is prepared in which residual stress in the surface is removed and a desired flatness is achieved by wet etching or the like. Then, the substrate 1 is set on a substrate table, and a crystal-adjusting layer 2 is grown thereon. In growing the crystal-adjusting layer 2, InP, as a first adjusting layer 2a, is grown to a thickness in a range from 10 nm to 60 nm both inclusive, e.g., to a thickness of about 10 nm. As source gases, TMIn (trimethylindium) or TEIn (triethylindium) is used as a source of In. As a source of P, $PH_3$ (phosphine) is used. Preferably, TBP (tertiarybutylphosphine) is used. These metal-organic gas sources are unstable because of large molecular weights thereof, and are easily decomposed even at a low deposition temperature (growth temperature) of 525° C. or lower, e.g., a low temperature in a range from 450° C. to 495° C. both inclusive, whereby an InP layer is epitaxially grown on the InP substrate. By growing the InP first adjusting layer 2a made of the same material as the InP substrate 1 at the low temperature, micro depressions and projections at the surface of the substrate and impurities such as oxygen caused by contact with the atmosphere after the wet etching are not activated, but are embedded in the InP first adjusting layer 2a. At this time, in order to make the first adjusting layer 2a have the first conductivity type, an n-type impurity is doped by using organic source gas. The n-type carrier concentration is set to about $3 \times 10^{17}$ $cm^{-3}$, for example.

Next, an InGaAs second adjusting layer 2b is grown to a thickness of 150 nm or more, e.g., a thickness of about 150 nm. As a source of Ga (gallium), TEGa (triethylgallium) or TMGa (trimethylgallium) may be used. As a source of In, the above-mentioned TMIn or TEIn is used. As a source of As (arsenic), arsine ($AsH_3$) is used. Preferably, TBAs (tertiarybutylarsine) or TMAs (trimethylarsenic) is used. When the second adjusting layer 2b is doped with an n-type impurity, the same impurity as that for the first adjusting layer 2a is used, and the n-type carrier concentration is set to about $3 \times 10^{17}$ $cm^{-3}$. Thereby, it is possible to epitaxially grow the InGaAs second adjusting layer 2b including the same material as one of the materials of the type II (InGaAs/GaAsSb) multiple quantum well structure constituting the absorption layer 3. The InGaAs second adjusting layer 2b functions as a base layer for the absorption layer 3 having the multiple quantum well structure, and thereby realizes good crystallinity in the multiple quantum well structure.

(Manufacturing Method for Modification 2)

In Modification 2, first, an Fe-doped semi-insulating InP substrate 1 is prepared in which residual stress in the surface is removed and a desired flatness is achieved by wet etching or the like. Then, the substrate 1 is set on a substrate table, and a crystal-adjusting layer 2 is grown thereon. In growing the crystal-adjusting layer 2, InP, as a first adjusting layer 2a, is grown to a thickness in a range from 10 nm to 60 nm both inclusive, e.g., to a thickness of about 30 nm. As source gases, TMIn (trimethylindium) or TEIn (triethylindium) is used as a source of In. As a source of P, phosphine ($PH_3$) or TBP (tertiarybutylphosphine) is used. These metal-organic gas sources are unstable because of large molecular weights thereof, and are easily decomposed even at a low deposition temperature (growth temperature) of 525° C. or lower, e.g., a low temperature in a range from 450° C. to 495° C. both inclusive, whereby the InP first adjusting layer 2a is epitaxially grown on the surface of the InP substrate.

In growing the InP first adjusting layer 2a, an n-type impurity, e.g., Si is doped at a high concentration of about $1\times10^{18}$ cm$^{-3}$. Preferably, tetraethylsilane (TeESi) or tetramethylsilane (TeMSi) may be used for Si doping. As described above, the substrate/epitaxial layer interface 18 is formed at the surface of the InP substrate 1, and oxygen and carbon remain on the interface 18 at high concentrations. By epitaxially growing the InP first adjusting layer 2a containing Si at a high concentration on the surface of the InP substrate 1, adverse effects of deposits such as oxygen (oxide) can be suppressed. Such deposits deteriorate crystallinity of the multiple quantum well, and degrade flatness of the interface of each layer in the multiple quantum well. Although it is unknown what mechanism of the first adjusting layer 2a containing the dopant at a high concentration improves quantum efficiency of the semiconductor device, it is highly likely that the interfaces in the multiple quantum well 3 being flattened are effective. The material of the first adjusting layer 2a is InP which is the material of the InP substrate 1. By growing the InP first adjusting layer 2a at the low temperature, micro depressions and projections at the surface of the substrate and impurities such as oxygen caused by contact with the atmosphere after the wet etching are not activated, but are embedded in the InP first adjusting layer 2a. It is also considered that the high concentration n-type dopant, Si, is concentrated in a local contact portion with the deposits at the epitaxial layer/substrate interface to increase flexibility, and thereby exerts an effect of improving crystallinity of the first adjusting layer as a whole.

Next, an InGaAs second adjusting layer 2b is grown to a thickness of 150 nm or more, e.g., a thickness of about 300 nm. As a source of Ga (gallium), TEGa (triethylgallium) or TMGa (trimethylgallium) may be used. As a source of In, the above-mentioned TMIn or TEIn is used. As a source of As (arsenic), arsine (AsH$_3$), TBAs (tertiarybutylarsine), or TMAs (trimethylarsenic) may be used. When the second adjusting layer 2b is doped with an n-type impurity, the same impurity as that for the InP first adjusting layer 2a is used, and the n-type carrier concentration is set to about $1\times10^{17}$ cm$^{-3}$. Thereby, it is possible to epitaxially grow the InGaAs second adjusting layer 2b including the same material as the material of one of each pair in the type II (InGaAs/GaAsSb) multiple quantum well structure constituting the absorption layer 3. The InGaAs second adjusting layer 2b functions as a base layer because the material thereof is the same as that of one of each pair in the multiple quantum well structure, and thereby realizes good crystallinity in the multiple quantum well structure.

Subsequent to the growth of the InGaAs second adjusting layer 2b of the crystal-adjusting layer 2 according to Modification 1 or Modification 2, an absorption layer 3 having a type II (InGaAs/GaAsSb) multiple quantum well structure, an InGaAs diffusive-concentration-distribution-adjusting layer 4, and an InP window layer 5 are continuously grown by metal-organic vapor phase epitaxy in the same growth chamber. As a result, interfaces 16 and 17 shown in FIGS. 2 and 7, respectively, are not regrown interfaces, and are free from residuals of oxygen and carbon at high concentrations. In other words, the interface 16 between the absorption layer 3 having the multiple quantum well structure and the diffusive-concentration-distribution-adjusting layer 4 and the interface 17 between the diffusive-concentration-distribution-adjusting layer 4 and the InP window layer 5 are free from impurities such as oxygen in the atmosphere. As a result, it is possible to prevent increase in dark current. At this time, the growth temperature or the substrate temperature is preferably maintained within a range from 400° C. to 525° C. both inclusive. If the growth temperature is higher than the temperature range, phase separation occurs extensively in the GaAsSb layer in the absorption layer 3. Therefore, the growth temperature is preferably 525° C. or lower, and more preferably, 500° C. or lower. If the growth temperature is lower than 400° C., source gases for MOVPE are not sufficiently decomposed and carbon is incorporated into the epitaxial layer. This carbon is derived from hydrocarbons bonded to metals in the source gases. Such carbon incorporated into the epitaxial layer results in formation of an unintended p-type region, which causes deterioration in performance of resultant semiconductor devices. For example, performance of resultant photodiodes is deteriorated. For example, the photodiodes have great dark current and cannot be practically used as products.

Next, growth of the absorption layer 3 having the multiple quantum well structure will be described. In each quantum well, GaAsSb has a thickness of 5 nm, and InGaAs also has a thickness of 5 nm, for example. For deposition of GaAsSb, TEGa (triethylgallium), TBAs (tertiarybutylarsine), and TMSb (trimethylantimony) are used. As a source of Sb (antimony), TMSb (trimethylantimony) or TESb (triethylantimony) may be used. Alternatively, TIPSb (triisopropylantimony) or TDMASb (trisdimethylaminoantimony) may be used. As a source of As (arsenic), arsine (AsH$_3$) may be used, or TBAs (tertiarybutylarsine) or TMAs (trimethylarsenic) may be used. For deposition of InGaAs, TEGa, TMIn, and TBAs can be used. These metal-organic gas sources are unstable because of large molecular weights thereof, and are completely decomposed at a relatively low temperature not lower than 400° C. but not higher than 525° C., thereby contributing to crystal growth. Thus, the multiple-quantum-well absorption layer 3 can be grown with a sharp composition change at the interface of each quantum well by metal-organic vapor phase epitaxy using only metal-organic sources. As a result, highly-accurate spectralphotometry can be achieved.

Hereinafter, a deposition apparatus for metal-organic vapor phase epitaxy using only metal-organic sources will be briefly described. A quartz tube is disposed in a growth chamber, and source gases are introduced into the quartz tube. In the quartz tube, a substrate table is rotatably and hermetically disposed. The substrate table is equipped with a heater for heating a substrate. The temperature of the surface of an epitaxial wafer 1a during deposition is monitored with an infrared thermometer through a window provided in a ceiling portion of the growth chamber. This monitored temperature is referred to as, for example, the growth temperature, or the deposition temperature, or the substrate temperature. Regarding formation of an InGaAs layer or the like at a temperature not lower than 400° C. but not higher than 525° C. in the manufacturing method of the present invention, the temperature not lower than 400° C. but not higher than 525° C. is measured in the temperature monitoring. Forced evacuation of the quartz tube is performed with a vacuum pump.

Source gases are supplied through pipes communicating with the quartz tube. Any number of types of source gases may be supplied to the quartz tube by increasing the number of pipes. The metal-organic source gases are contained in constant temperature baths and kept at constant temperatures. As carrier gases, hydrogen (H$_2$) and nitrogen (N$_2$) are used. The metal-organic gases are carried with the carrier gases and sucked with a vacuum pump to be introduced into the quartz tube. The flow rates of the carrier gases are accurately controlled with mass-flow controllers (MFC). A large number of mass-flow controllers, electromagnetic valves, and the like are automatically controlled with microcomputers.

EXAMPLES

Example 1

In order to verify the functions of the present invention, the photodiode 50 according to Modification 1 shown in FIG. 6 was experimentally manufactured as Example A1 of the present invention, and sensitivity thereof was measured. Two samples, Example A1 of the present invention and Comparative Example C1, were prepared. In addition, as Reference Example R1, sensitivity calculated based on data shown in FIG. 5 of NON-PATENT LITERATURE 1 was used.

Example A1 of the Present Invention

First Adjusting Layer/Second Adjusting Layer=InP/InGaAs (1) Layered structure: InP substrate/InP first adjusting layer/InGaAs second adjusting layer/type II (InGaAs (5 nm)/GaAsSb (5 nm)) absorption layer of 2 μm/InGaAs diffusive-concentration-distribution-adjusting layer of 1 μm/InP window layer of 0.75 μm (2) Structure of crystal-adjusting layer: n-type InP first adjusting layer (thickness: 10 nm, carrier concentration: $3 \times 10^{17}$ cm$^{-3}$)/n-type InGaAs second adjusting layer (thickness: 150 nm, carrier concentration: $3 \times 10^{17}$ cm$^{-3}$)

Comparative Example C1

First Adjusting Layer/Second Adjusting Layer=InP/InP (1) Layered structure: InP substrate/InP first adjusting layer/InP second adjusting layer/type II (InGaAs (5 nm)/GaAsSb (5 nm)) absorption layer of 2 μm/InGaAs diffusive-concentration-distribution-adjusting layer of 1 μm/InP window layer of 0.75 μm (2) Structure of crystal-adjusting layer: n-type InP first adjusting layer (thickness: 10 nm, carrier concentration: $3 \times 10^{17}$ cm$^{-3}$)/n-type InP second adjusting layer (thickness: 150 nm, carrier concentration: $3 \times 10^{17}$ cm$^{-3}$)

Reference Example (Non-Patent Literature 1) R1

First Adjusting Layer/Second Adjusting Layer=InGaAs/InGaAs (1) Layered structure: InP substrate/InGaAs first adjusting layer/InGaAs second adjusting layer/type II (InGaAs (5 nm)/GaAsSb (5 nm)) absorption layer of 1.5 μm/InGaAs diffusive-concentration-distribution-adjusting layer of 45 nm/InGaAs window layer of 0.5 μm (2) Structure of crystal-adjusting layer: n-type InGaAs first adjusting layer (thickness: 500 nm, carrier concentration: high)/intrinsic type InGaAs second adjusting layer (thickness: 50 nm, carrier concentration: low)

In Reference Example R1, the magnitude relationship between the thickness of the first adjusting layer of the crystal-adjusting layer and the thickness of the second adjusting layer thereof is inverted as compared to that of Example A1 of the present invention. The InP substrate in the Example A1 of the present invention and Comparative Example C1 is an S-doped InP substrate. The InP substrate of Reference Example R1 according to NON-PATENT LITERATURE 1 seems to contain S or another n-type impurity because it is described as "N-type".

Figure 8:
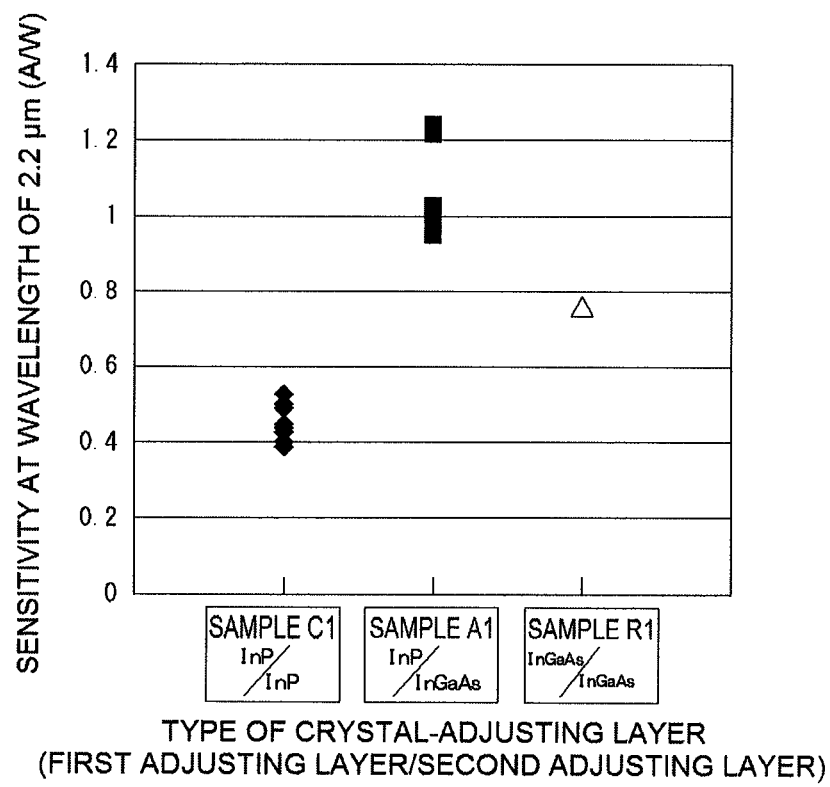
FIG. 8 is a diagram showing sensitivities of samples in Example 1.

FIG. 8 shows measurement results of sensitivities at a wavelength of 2.2 μm, of Example A1 of the present invention and Comparative Example C1. FIG. 8 also shows, as Reference Sample R1, sensitivity calculated based on data shown in FIG. 5 of NON-PATENT LITERATURE 1. In FIG. 8, those examples are represented as Sample A1, Sample C1, and Sample R1, respectively. According to FIG. 8, Sample A1 of the present invention in which the crystal-adjusting layer (=first adjusting layer/second adjusting layer) is InP/InGaAs has the highest sensitivity, i.e., about 1.0 to 1.2.

In contrast, Sample C1 of Comparative Example in which the crystal-adjusting layer is InP/InP has significantly low sensitivity, i.e., about 0.4 to 0.5. Further, Sample R1 of Reference Example has sensitivity of about 0.75, which is lower than the sensitivity of the present invention.

Example 2

In order to examine influences of n-type dopant concentration in the first adjusting layer and the second adjusting layer of the crystal-adjusting layer, two samples were manufactured in accordance with the structure of the photodiode 50 of Modification 2 shown in FIG. 7. Specifically, Sample A2 and Sample A3 were manufactured. Sample A2 and Sample A3 are common in the following portions of the photodiodes.

<Materials of epitaxial wafer>: (Fe-doped semi-insulating InP substrate 1/InP first adjusting layer 2a/InGaAs second adjusting layer 2b/absorption layer 3 having type II (InGaAs/GaAsSb) multiple quantum well structure/InGaAs diffusive-concentration-distribution-adjusting layer 4/InP window layer 5):

<thickness of InP first adjusting layer 2a/InGaAs second adjusting layer 2b>: 30 nm/300 nm Sample A2 and Sample A3 are different from each other in the following points:

(Sample A2): Si concentration of InP first adjusting layer 2a: $1 \times 10^{18}$ cm$^{-3}$/Si concentration of InGaAs second adjusting layer 2b: $1 \times 10^{17}$ cm$^{-3}$ (Sample A3): Si concentration of InP first adjusting layer 2a: $1 \times 10^{17}$ cm$^{-3}$/Si concentration of InGaAs second adjusting layer 2b: $1 \times 10^{17}$ cm$^{-3}$ In the photodiodes of the respective samples, light having a wavelength of 2.2 μm (monochromatic light) was applied to the rear surface of the InP substrate, and sensitivities were measured.

Measured sensitivities of Sample A2 and Sample A3 are 1.5 A/W and 1.2 A/W, respectively. Although Samples A2 and A3 both show high sensitivities, it is found that Sample A2 in which the n-type dopant concentration in the first adjusting layer is higher than the n-type dopant concentration in the second adjusting layer has more improved sensitivity.

INDUSTRIAL APPLICABILITY

According to the semiconductor device, for example, the photodiode, of the present invention, the structure of the crystal-adjusting layer or the buffer layer between the absorption layer and the substrate is appropriately modified, whereby sensitivity is improved in the near-infrared to infrared region.

DESCRIPTION OF THE REFERENCE CHARACTERS

1 InP substrate
2 crystal-adjusting layer
2a first adjusting layer
2b second adjusting layer
3 absorption layer having type II multiple quantum well structure
4 InGaAs diffusive-concentration-distribution-adjusting layer
5 InP window layer
6 p-type region
10 epitaxial wafer
11 p-electrode (pixel electrode)
12 ground electrode (n-electrode)
15 p-n junction
16, 17 interface of epitaxial layers
18 epitaxial layer/substrate interface
35 antireflection (AR) layer
36 selective diffusion mask pattern
50 photodiode (photodiode array)
P pixel
S depletion layer

The invention claimed is:

1. A semiconductor device, comprising:
a III-V semiconductor substrate;
a multiple quantum well structure disposed on the substrate, and including a plurality of pairs of a layer a and a layer b; and
a crystal-adjusting layer disposed between the substrate and the multiple quantum well structure, wherein
the crystal-adjusting layer includes a first adjusting layer which is made of the same material as the substrate and is in contact with the substrate, and a second adjusting layer which is made of the same material as the layer a or the layer b of the multiple quantum well structure.

2. The semiconductor device according to claim 1, wherein
a first conductivity type dopant concentration in the first adjusting layer is higher than a first conductivity type dopant concentration in the second adjusting layer.

3. The semiconductor device according to claim 2, wherein
the first conductivity type dopant concentration in the first adjusting layer is 5 times or more of the first conductivity type dopant concentration in the second adjusting layer.

4. The semiconductor device according to claim 1, wherein
a thickness of the first adjusting layer is ⅕ or less of a thickness of the second adjusting layer.

5. The semiconductor device according to claim 1, wherein
a thickness of the first adjusting layer is not less than 10 nm but not more than 60 nm, and a thickness of the second adjusting layer is not less than 150 nm.

6. The semiconductor device according to claim 1, further comprising a first conductivity side electrode, the first conductivity side electrode being in ohmic contact with the crystal-adjusting layer.

7. The semiconductor device according to claim 1, further comprising a first conductivity side electrode, the first conductivity side electrode being in ohmic contact with a rear surface of the substrate.

8. The semiconductor device according to claim 1, wherein
the substrate is any one of InP, GaSb, and GaAs, the multiple quantum well structure is a type II multiple quantum well structure, and each pair a/b is InGaAs/GaAsSb or InAs/GaSb.

9. The semiconductor device according to claim 1, wherein
the substrate is InP, and the multiple quantum well structure is a type II InGaAs/GaAsSb multiple quantum well structure, and
in the crystal-adjusting layer, the first adjusting layer is InP, and the second adjusting layer is InGaAs.

10. The semiconductor device according to claim 1, wherein
the semiconductor device is a photodiode including the multiple quantum well structure as an absorption layer.

11. An optical sensor device including the semiconductor device according to claim 10, and a read-out circuit.

12. A method for manufacturing a semiconductor device by metal-organic vapor phase epitaxy, the method comprising the steps of:
growing a crystal-adjusting layer in contact with a III-V semiconductor substrate; and
growing a type II multiple quantum well structure including a plurality of pairs of a layer a and a layer b, in contact with the crystal-adjusting layer, wherein
the crystal-adjusting layer is composed of a first adjusting layer and a second adjusting layer,
the first adjusting layer is grown by using the same material as the substrate, so as to be in contact with the substrate,
the second adjusting layer is grown by using the same material as the layer a or the layer b, on the first adjusting layer so as to be in contact with a lower surface of the multiple quantum well structure, and
a first conductivity type dopant concentration in the first adjusting layer is higher than a first conductivity type dopant concentration in the second adjusting layer.

13. The method for manufacturing a semiconductor device according to claim 12, wherein
in the step of growing the crystal-adjusting layer, a thickness of the first adjusting layer is ⅕ or less of a thickness of the second adjusting layer.

14. The method for manufacturing a semiconductor device according to claim 12, further comprising a step of forming a first conductivity side electrode, wherein
the second adjusting layer is removed by using a selective etchant that etches the second adjusting layer but does not etch the first adjusting layer, and thereafter, the first conductivity side electrode is formed in contact with the first adjusting layer.

* * * * *